United States Patent
Patterson

(10) Patent No.: US 7,402,469 B1
(45) Date of Patent: Jul. 22, 2008

(54) SYSTEM AND METHOD FOR SELECTIVITY ETCHING AN INTEGRATED CIRCUIT

(75) Inventor: Joseph M. Patterson, Carlsbad, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 11/652,921

(22) Filed: Jan. 12, 2007

(51) Int. Cl.
  *H01L 21/336* (2006.01)
(52) U.S. Cl. .................................. 438/157
(58) Field of Classification Search ............... 438/5–7, 438/14–18, 22–24, 30–31, 34, 128, 149–151, 438/48, 674, 680, 795, 482
  See application file for complete search history.

(56) References Cited

U.S. PATENT DOCUMENTS

| | | | | |
|---|---|---|---|---|
| 6,248,973 B1* | 6/2001 | Matsumura et al. | .... | 219/121.69 |
| 6,447,979 B1* | 9/2002 | Hattori et al. | ............ | 430/270.1 |
| 2003/0027053 A1* | 2/2003 | Yan | ................................ | 430/5 |
| 2006/0023058 A1* | 2/2006 | Tanaka | ........................ | 347/224 |
| 2006/0043510 A1* | 3/2006 | Yamazaki et al. | ........... | 257/432 |
| 2006/0202615 A1* | 9/2006 | Murakami et al. | .......... | 313/506 |
| 2007/0023790 A1* | 2/2007 | Ohnuma et al. | ............. | 257/267 |

* cited by examiner

*Primary Examiner*—Scott B. Geyer
*Assistant Examiner*—Andre' Stevenson
(74) *Attorney, Agent, or Firm*—Law Office of Gerald Maliszewski; Gerald Maliszewski

(57) ABSTRACT

A method is provided for selectively marking a region of integrated circuit (IC). The method provides an IC die with a first region located on a backside surface of a bulk silicon (Si) layer. A semi-transparent film is formed overlying the bulk Si layer, semi-transparent to light having a first wavelength. The semi-transparent film is irradiated with light having the first wavelength in the range of 1 to 2 microns. In response to irradiating the semi-transparent film with a first power density, the IC die first region is located. Then, in response to irradiating the semi-transparent film with a second power density, greater than the first power density, a region of the semi-transparent film is marked overlying the IC die first region. In one aspect, a region of the bulk Si layer underlying the marked (or ablated away) semi-transparent film is selectively etched to expose the IC die first region.

14 Claims, 5 Drawing Sheets

SYSTEM AND METHOD FOR SELECTIVITY ETCHING AN INTEGRATED CIRCUIT

BACKGROUND OF THE INVENTION

1. Field of the Invention

This invention generally relates to integrated circuits (ICs) and, more particularly, to a post-production method for selectively etching an IC, to expose regions of a fabricated IC die for investigation or repair.

2. Description of the Related Art

IC production facilities are established so that thousands of fragile parts can be safely processed in a short amount of time, with little human intervention. IC dice are parallel processed on a wafer, and each die may include thousands, or even millions of electrical components, such as transistors and resistors, distributed over multiple interconnected layers. Typically, an IC die is tested after fabrication, and many "internal" test points are exposed at this point in the process. After attachment to an IC package, for example using an epoxy adhesive, only the package external interfaces, or pins are accessible.

While it is rarely cost effective to repair an IC die after it has been assembled into a package, there are many circumstances where it desirable to reverse engineer, perform fault analysis, or access an internal test point to monitor performance under realistic load conditions. Typically, it is easier to access the backside of the IC, which is the first layer of IC die circuitry. Therefore, it is necessary to remove a region of the bulk silicon (Si) wafer upon which the IC has been fabricated. Depending on the package style, the package or part of the package may be removed to access the bulk Si wafer.

Once the region of interest is exposed, a "picoprobe", which is a probe with a field effect transistor (FET) input and very fine tip, can be used to measure electrical signals. Alternately, temperature measurements can be made, or a photon emission microscope (PEM) may be used to measure light being emitted from operating transistors. Further, a scanning electron-beam microscope (SEM) may be used to measure electron flow.

However, it is difficult to precisely locate a window through the bulk Si to the backside of the IC die. It is also difficult to efficient make such a window, without damaging the IC die, in a time effective manner. Although laser and chemical etching processes may be used to form openings in thin-film passivation layers, generally a focused ion beam (FIB) is the tool of choice for etching through the relatively thick bulk Si layer.

FIB systems have a fine resolution, better than 0.1 microns, and can forms holes with an aspect ratio of up to 18:1. A FIB is similar to a scanning electron microscope, but uses a focused beam of gallium ions instead of electrons. The ions are accelerated to an energy of up to 50 keV, and focused with an electrostatic lenses. A FIB can deliver tens of nanoamps of current to a selected region, or can image the region with a spot size on the order of a few nanometers.

The FIB ions are inherently destructive, as they sputter atoms from the surface they strike. As a result, the FIB can be used as a micro-machining tool, to etch features at a very fine scale. Further, FIB can be used to deposit material via ion beam induced deposition of FIB-assisted chemical vapor deposition (CVD). Thus, FIB is used to modify an existing IC, remove electrical connections, or deposit a conductive metal.

To form a window through the bulk Si wafer to the backside of the IC die, the bulk Si wafer is initially thinned using a polishing process. Then, it is typically necessary to use the FIB to form three of four alignment holes to find alignment markings. Once the alignment is known, a window can be sputtered to the desired die region. Alternately, the FIB may be accessorized with a con-focal laser to perform the alignment. However, these instruments are very expensive and the etching must be performed one window at a time, which is slow and costly.

It would be advantageous if a method existed for forming windows through a Si wafer, to an IC die, that was faster and more efficient than the above-described conventional FIB process.

SUMMARY OF THE INVENTION

The present invention describes an improved method to minimize the use of FIB tools in accessing a desired IC die region through a bulk Si wafer. A thin layer of polyimide, or other suitable material, is deposited on the back of the silicon die. Assuming the die has been assembled in a flip/chip package, so that the package is attached to the die top surface, the die is examined from the backside using a near infrared (IR) laser microscope. The laser can image through the thin polyimide coating and the bulk silicon of the die, to the desired circuitry, using a low laser power. When the desired site is selected, the laser power is increased significantly, and scanned over the area to be etched. The higher laser power ablates the polyimide in that area and exposes the silicon for chemical etching. The remaining polyimide can be used as a mask to protect covered regions from a silicon etch, such as potassium hydroxide. Multiple windows can be opened with the laser, and all windows can be etched simultaneously with the chemical etchant. This process saves considerable time, as compared to making one hole at a time with Focused Ion Beam or laser enhanced chemical etching processes.

Accordingly, a method is provided for selectively marking a region of integrated circuit (IC). The method provides an IC die with a first region located on a backside surface of a bulk silicon (Si) layer. A semi-transparent film is formed overlying the bulk Si layer, semi-transparent to light having a first wavelength. For example, the film may be a polyimide or polyethylene terephthalate (boPET) polyester. The semi-transparent film is irradiated with light having a first wavelength in the range of 1 to 2 microns. In response to irradiating the semi-transparent film with a first power density, the IC die first region is located. Then, in response to irradiating the semi-transparent film with a second power density, greater than the first power density, a region of the semi-transparent film is marked overlying the IC die first region.

In one aspect, a region of the bulk Si layer underlying the semi-transparent film marked or ablated region is selectively etched. Then, in response to the etching, the IC die first region is exposed. For example, the ablated film region may be removed to expose the underlying bulk Si layer region. The remaining semi-transparent film acts as a mask to protect the covered bulk Si. A chemical etchant is introduced and selected etches only the bulk Si layer region overlying the IC die first region.

Additional details of the above-described method are described below.

DETAILED DESCRIPTION

Figure 1:
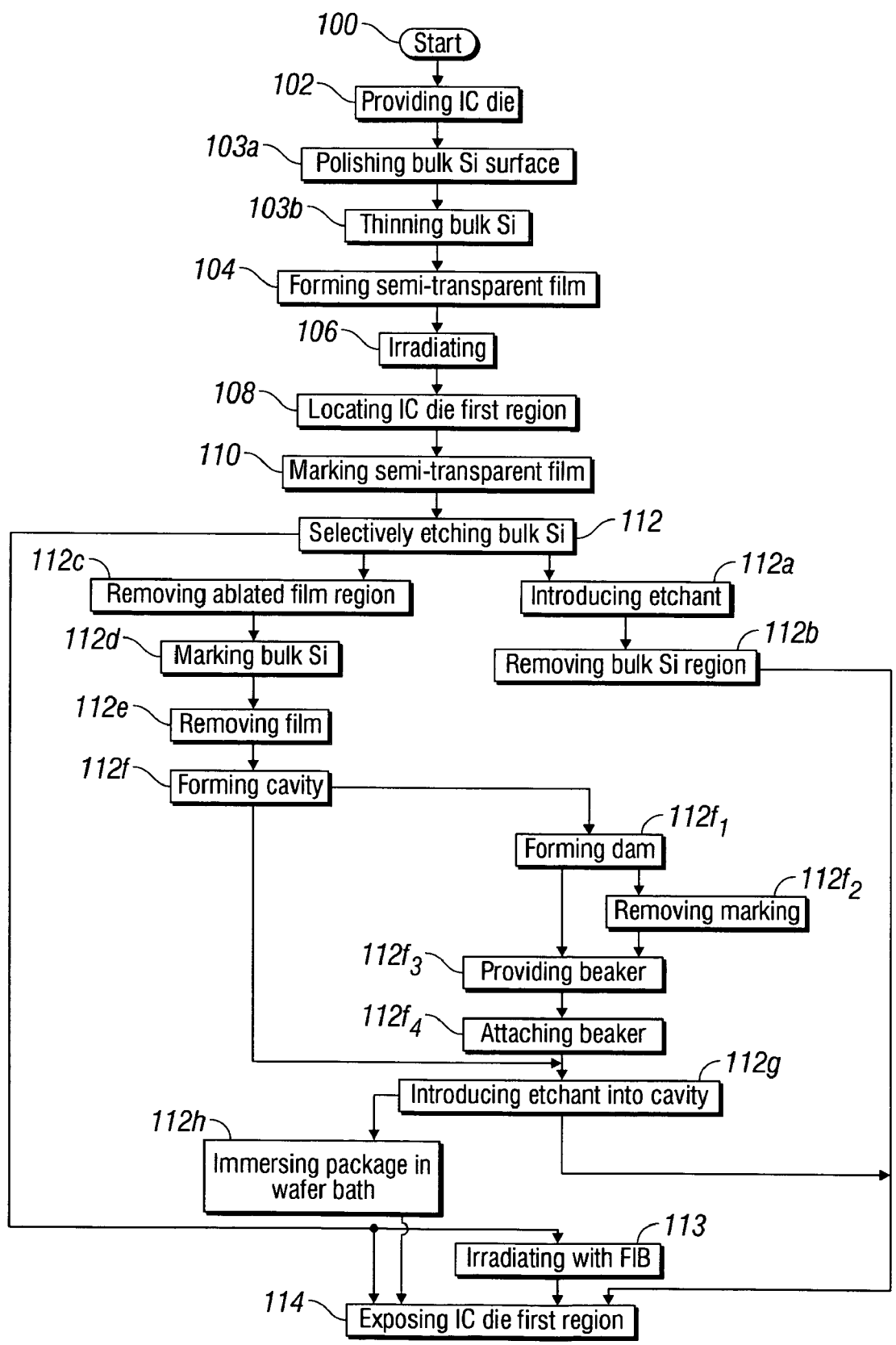
FIG. 1 is a flowchart illustrating a method for selectively marking a region of integrated circuit (IC).

FIG. 1 is a flowchart illustrating a method for selectively marking a region of integrated circuit (IC). Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 100.

Step 102 provides an IC die with a first region located on a backside surface of a bulk silicon (Si) layer. Step 104 forms a semi-transparent film overlying the bulk Si layer, semi-transparent to light having a first wavelength. That is, the semi-transparent layer does not transmit 100% of incident light having the first wavelength. For example, the film may be semi-transparent to light having a wavelength greater than about 1 micron and less than about 2 microns. Step 106 irradiates the semi-transparent film with light having the first wavelength. In response to irradiating the semi-transparent film with a first power density, Step 108 locates the IC die first region. Silicon is transparent to wavelengths of light greater than 1.1 microns, but opaque to visible light. Typically, the laser light source is equipped with a laser scanning microscope (LSM). The reflected laser light is detected, and as the laser scans the sample areas, the reflected signal is displayed as video on a CRT to form an image. This LSM microscope may cost $50 to 75K, which is only 5 to 10% of the cost of an entire FIB system. Failure analysis labs often use an LSM for other unrelated purposes.

The bulk Si wafer is transparent to light having a wavelength of between 1 and 2 microns. In response to irradiating the semi-transparent film with a second power density, greater than the first power density, Step 110 marks a region of the semi-transparent film. That is, the light energy being absorbed by the semi-transparent film is sufficient to at least partially damage, or ablate the film.

In one aspect, prior to forming the semi-transparent film in Step 104, Step 103a polishes a bulk Si layer surface overlying the IC die backside. In response to the polishing, Step 103b thins the bulk Si layer overlying the IC die first region. For example, a mechanical polishing process can be used to mill the bulk Si down to a thickness of less than 100 microns (e.g., about 50 microns).

Figure 2:
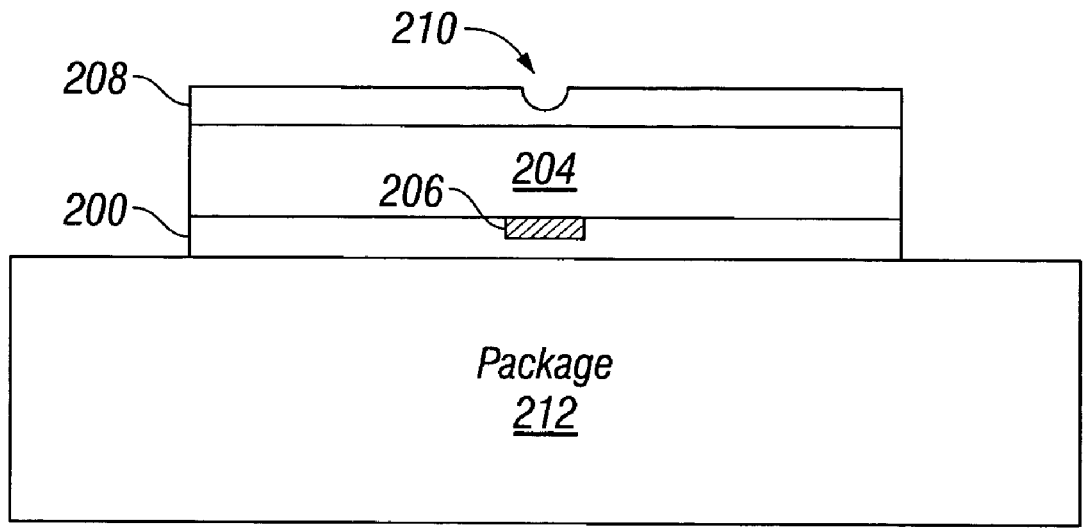
FIG. 2 is a partial cross-sectional view of an IC die attached to a flip/chip package.

FIG. 2 is a partial cross-sectional view of an IC die attached to a flip/chip package. The IC die 200 has a backside 202 of a bulk Si wafer 204. Although not specifically shown, the IC die 200 may be comprised of multiple interconnected layers of active and passive electrical components. Also shown is the IC die first region 206. The semi-transparent film 208, with ablated region 210, is shown overlying the bulk Si layer 204. In one aspect, the film 208 can be polyimide (e.g., Kapton™)

or polyethylene terephthalate (boPET) polyester (e.g., Mylar™). The IC die is attached to a package 212.

The "chip" part of the flip/chip package refers to the silicon die. Most of the die, about 95+% by volume, is bulk silicon upon which the active circuitry is built. This active circuitry is built on the top surface of the die. In flip/chip package configuration the top of the die is facing and attached to the package. In this case, the package is just a flat piece of printed circuit (PC) board. The back of the die (the bulk silicon) has no package attached to it. Some package types do have a metal heat sink or lid over the back of the die, which is considered part of the package. This lid or heat sink is removed before the present invention process is started.

The intent of the process is to selectively remove all of the bulk silicon (starting at the back) at a localized site to access the thin layer of active circuitry on the die frontside through the backside.

Although a flip/chip die and package are used as an example, many other die and package types are known in the art. While some of these other package styles may require some handling steps other than those specifically described herein, once the bulk Si covering the desired IC die site is exposed, the process is essentially the same for all die and package styles.

Returning to FIG. 1, in some aspect of the method Step 112 selectively etches a region of the bulk Si layer underlying the semi-transparent film ablated region. In response to the etching, Step 114 exposes the IC die first region.

In one aspect, ablating the region of semi-transparent film in Step 110 includes removing the marked region of the semi-transparent film and exposing the bulk Si layer region. Then, selectively etching the bulk Si layer region in Step 112 includes substeps. Step 112a introduces a chemical etchant. In response to the etchant, Step 112b removes the bulk Si layer region overlying the IC die first region.

Figure 3:
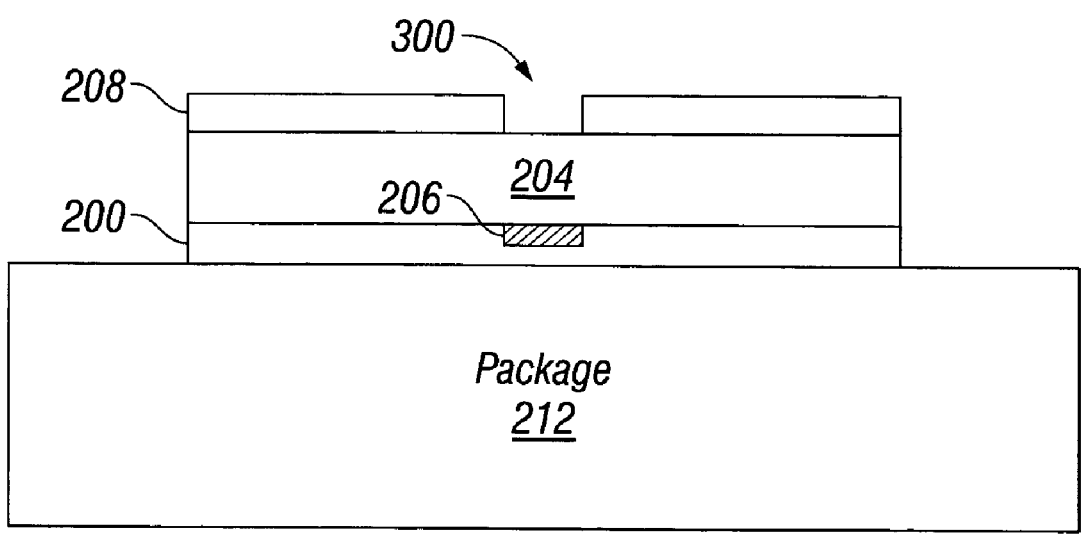
FIG. 3 is a partially cross-section view of the IC die depicted in FIG. 2, following the performance of Steps 112 and 114.

FIG. 3 is a partially cross-section view of the IC die depicted in FIG. 2, following the performance of Steps 112 and 114. Initially, the ablated area of semi-transparent film (see FIG. 2) is removed using a chemical etching, mechanically milling, or sputtering process. Once a window 300 is cleared through the film 208, an etchant can be added that attacks the exposed region of the bulk Si layer 204, and exposes the IC die first region 206. The film 208 acts as a mask to protect the covered areas of bulk Si wafer 204. A wide variety of Si etchants are known in the art that are suitable for this purpose. Once the etching is complete, the film 208 can be removed. In another aspect of the method, one film (film 208) is used for marking, and a different film (not shown) is used as a mask.

Returning to FIG. 1, in a different aspect of the method, selectively etching the bulk Si layer region underlying the semi-transparent film ablated region in Step 112 includes an alternate set of substeps. Step 112c removes the ablated region of semi-transparent film, exposing the IC package backside surface region. Step 112d marks the exposed bulk Si layer region. For example, a carbon paint may be used for marking. Step 112e removes the semi-transparent film. Step 112f forms an etch-resistant cavity overlying the marked bulk Si layer region, and Step 112g introduces etchant into the cavity.

Figure 4:
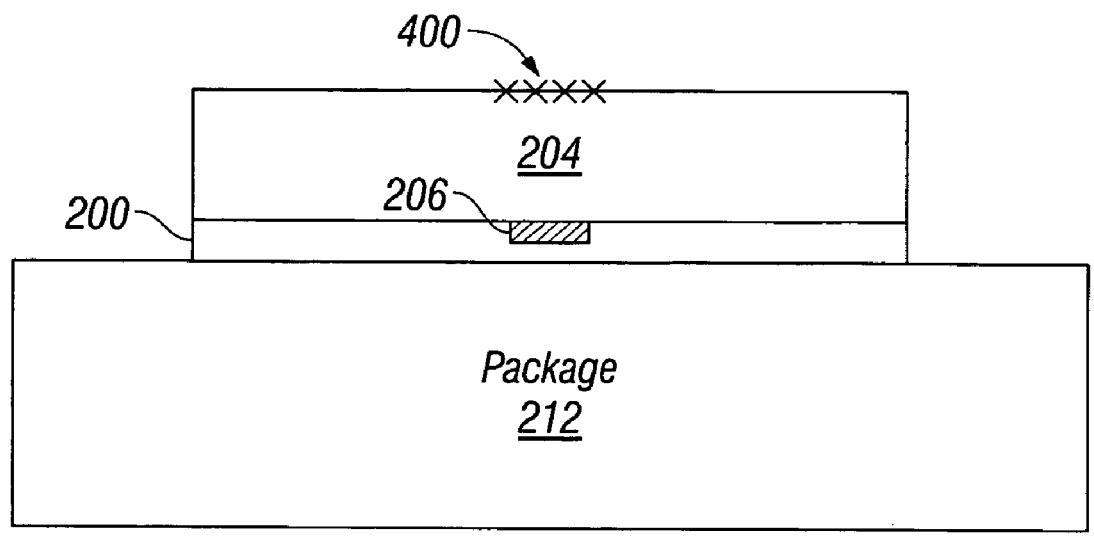
FIGS. 4 and 5 are partially cross-sectional views of the IC die of FIG. 2, depicting the performance of Steps 112c through 112g.
Figure 5:
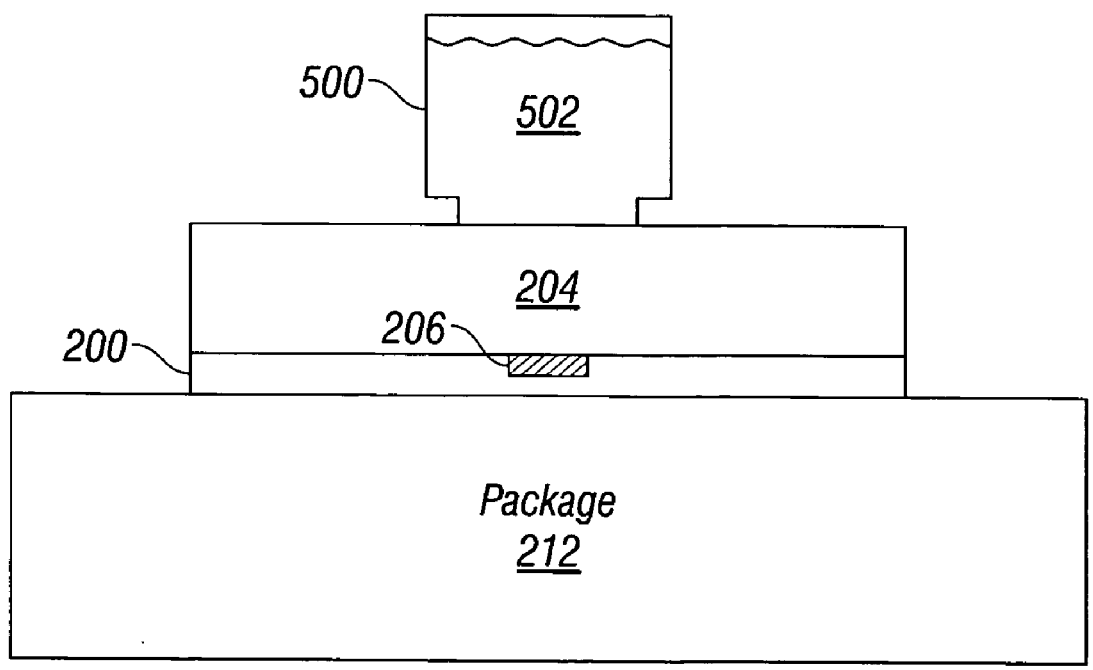

FIGS. 4 and 5 are partially cross-sectional views of the IC die of FIG. 2, depicting the performance of Steps 112c through 112g. In FIG. 4, the ablated region of film has been removed, via chemical or physical means, and the exposed area 400 of bulk Si layer 204 has been marked. In FIG. 5, an etch-resistance cavity 500 is formed, filled with an etchant 502, for introduction to the exposed region of bulk Si layer 204.

Returning to FIG. 1, in one aspect, forming the etch-resistant cavity in Step 112*f* includes substeps. Step 112*f*1 forms an etch-resistant sealant dam surrounding the marked bulk Si layer region. For example, the dam may be made from an epoxy material or fast-setting "super glue" type adhesive. Step 112*f*3 provides a beaker with a bottom. Typically, the beaker has a hole already formed in the bottom of the beaker. The hole may be larger than the marked site on the silicon to allow easy access for the etchant. A larger hole also reduces the formation of bubbles that get trapped and slow the etch process. In some aspects, the beaker with the hole is aligned over the marked site using a low magnification microscope. Step 112*f*4 attaches the beaker bottom overlying the sealant dam. Then, introducing etchant into the cavity in Step 112*g* includes adding etchant into the beaker. In one aspect, Step 112*f*2, subsequent to forming the etch-resistant sealant dam, removes the marking (e.g., carbon paint) formed in Step 112*d*.

Figure 6:
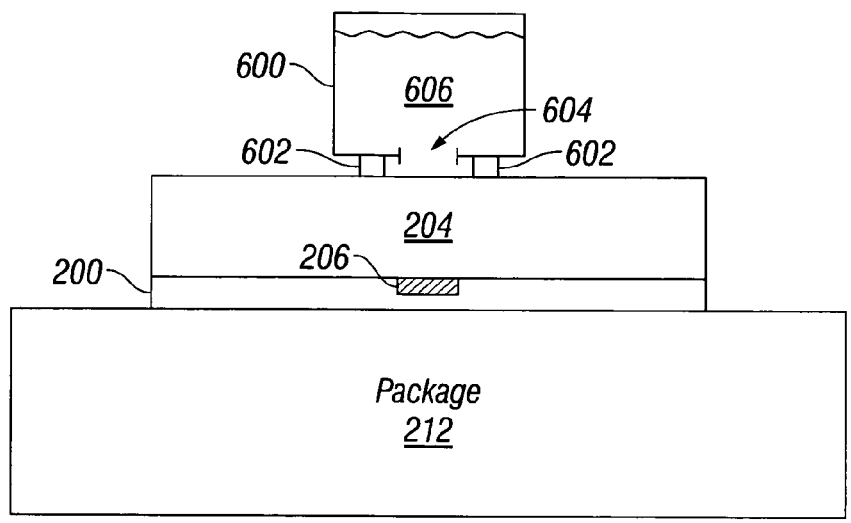
FIG. 6 is a partially cross-sectional view of the IC die of FIG. 4, with an etchant-resistant cavity formed from a beaker and an etch-resistant sealant dam.

FIG. 6 is a partially cross-sectional view of the IC die of FIG. 4, with an etchant-resistant cavity formed from a beaker 600 and an etch-resistant sealant dam 602. A hole 604 in the beaker 600 permits etchant 606 to escape the beaker and contact the exposed region of bulk Si overlying the IC first region 206.

Figure 7:
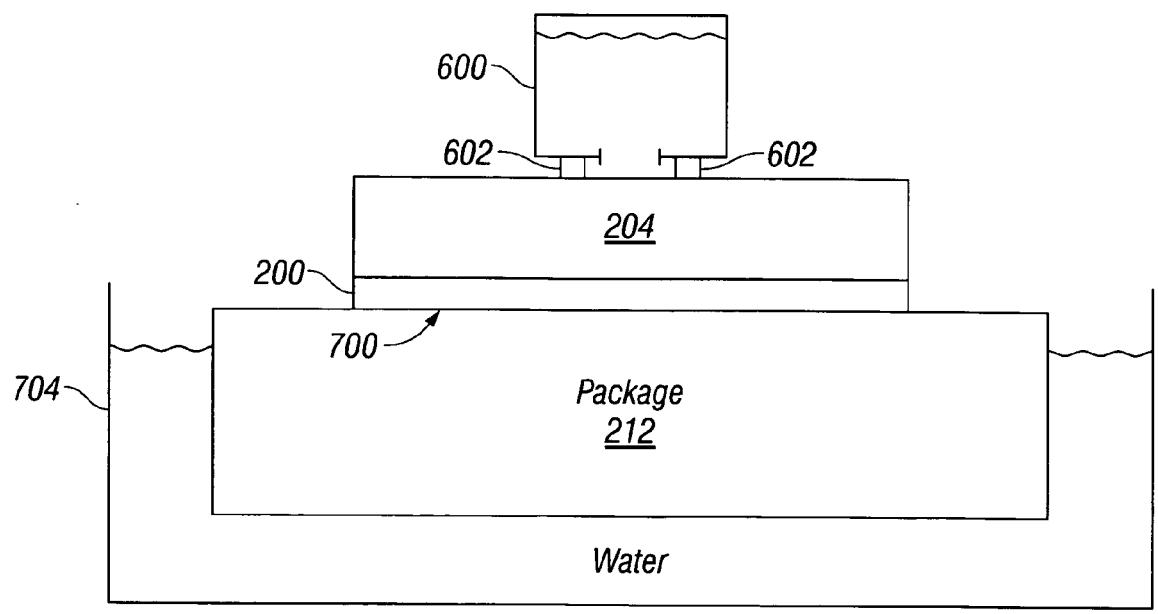
FIG. 7 is a partial cross-sectional view of the IC die of FIG. 5, where the IC die includes a front surface attached to a package.

Returning to FIG. 1, in another aspect of the method, Step 102 provides an IC die with a front surface attached to an IC package (see FIG. 7). Simultaneous with introducing the etchant into the cavity (Step 112*g*, Step 112*h* immerses the IC package in a water bath. For example, the water may have a temperature in a range of 70° C. to 90° C.

FIG. 7 is a partial cross-sectional view of the IC die of FIG. 5, where the IC die 200 includes a front surface 700 attached to a package 212. To protect the package 212 (e.g. a flip/chip package) from being accidentally attacked by etchant, the package is immersed in a water bath 704. Any escaping etchant is diluted in the water. Other solutions besides water may also be used.

Figure 8:
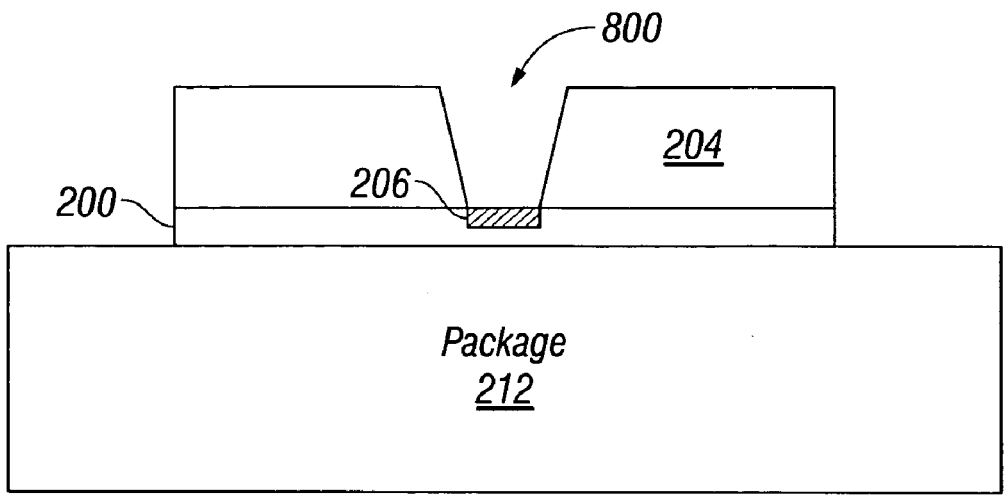
FIG. 8 is a partial cross-sectional view depicted the IC die after the bulk Si overlying the IC die first region has been removed.

In a different aspect, Step 112 selectively etches a region of the bulk Si layer underlying the semi-transparent film marked region. For example, either of the two above-described processes can be used for this selective etching. However, in this aspect the chemical etchant does not completely remove the bulk Si overlying the IC die first region. Step 113 irradiates the selectively etched region of the bulk Si layer with a focused ion beam (FIB). Then, Step 114 exposes the IC die first region in response to the FIB. Even though a FIB is involved, the selective etching minimizes its use, FIG. 8 is a partial cross-sectional view depicted the IC die after the bulk Si overlying the IC die first region has been removed. The first region 206 can be accessed through window 800.

Figure 9:
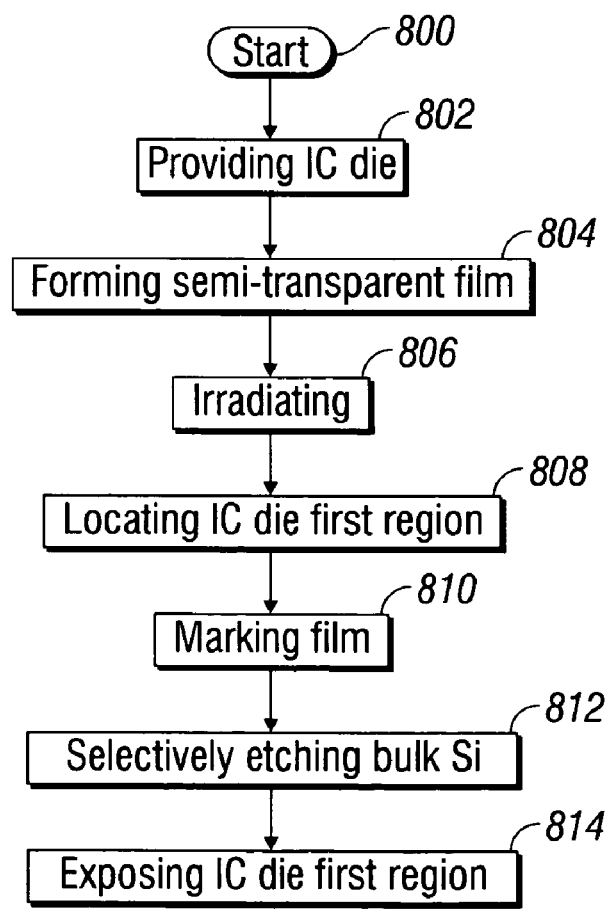
FIG. 9 is a flowchart illustrating a method for selectively exposing a region of IC die.

FIG. 9 is a flowchart illustrating a method for selectively exposing a region of IC die. The method starts at Step 800. Step 802 provides an IC die with a first region, located on a backside surface of a bulk Si layer. Step 804 forms a semi-transparent film overlying the bulk Si layer, semi-transparent to light having a first wavelength. Step 806 irradiates the semi-transparent film with light having the first wavelength. In response to irradiating the semi-transparent film with a first power density, Step 808 locates the IC die first region. In response to irradiating the semi-transparent film with a second power density, greater than the first power density, Step 810 marks a region of the semi-transparent film. Step 812 selectively etches a region of the bulk Si layer underlying the semi-transparent film marked region. Step 814 exposes the IC die first region.

In one aspect, marking the region of semi-transparent film with the second power density in Step 810 includes ablating a region of semi-transparent film overlying the IC die first region. Then, exposing the IC die first region in Step 814 includes exposing the IC die first region in response to the selective etching the bulk Si region underlying the ablated region of semi-transparent film.

In another aspect, exposing the IC die first region in Step 814 includes exposing the IC die first region in response to irradiating the selectively etched bulk Si region with a FIB.

A method has been provided for selectively marking and etching an IC die, so that selected areas of the die can be accessed. Specific materials, package styles, and process details have been given to illustrate the invention. However, the invention is not limited to merely these examples. Other variations and embodiments of the invention will occur to those skilled in the art.

I claim:

1. A method for selectively marking a region of integrated circuit (IC), the method comprising:

providing an IC die with a first region located on a backside surface of a bulk silicon (Si) layer;

forming a semi-transparent film overlying the bulk Si layer, semi-transparent to light having a first wavelength;

irradiating the semi-transparent film with light having the first wavelength;

in response to irradiating the semi-transparent film with a first power density, locating the IC die first region;

in response to irradiating the semi-transparent film with a second power density, greater than the first power density, marking a region of the semi-transparent film by ablating a region of semi-transparent film overlying the IC die first region;

selectively etching a region of the bulk Si layer underlying the semi-transparent film ablated region as follows:

removing the ablated region of semi-transparent film exposing the IC package backside surface region;

marking the exposed bulk Si layer region;

removing the semi-transparent film;

forming an etch-resistant cavity overlying the marked bulk Si layer region; and, introducing etchant into the cavity; and, in response to the etching, exposing the IC die first region.

2. The method of claim 1 wherein irradiating the semi-transparent film with light includes irradiating with light having a first wavelength of greater than about 1 micron and less than about 2 microns.

3. The method of claim 1 wherein forming the semi-transparent film includes forming a film selected from a group consisting of polyimide and polyethylene terephthalate (boPET) polyester films.

4. The method of claim 1 wherein forming the etch-resistant cavity includes:

forming an etch-resistant sealant dam surrounding the marked bulk Si layer region;

providing a beaker with a bottom; and, attaching the beaker bottom overlying the sealant dam.

5. The method of claim 4 wherein providing the beaker includes providing a beaker with a hole in the beaker bottom overlying the marked bulk Si layer region; and, wherein introducing the etchant into the cavity includes adding etchant into the beaker.

6. The method of claim 4 wherein marking the bulk Si layer region includes marking with a carbon paint; and, the method further comprising:
subsequent to forming the etch-resistant sealant dam, removing the carbon paint.

7. The method of claim 4 wherein forming an etch-resistant sealant dam includes using an epoxy sealant.

8. The method of claim 1 wherein providing the IC die includes providing an IC die with a front surface attached to an IC package;
the method further comprising:
simultaneous with introducing the etchant into the cavity, immersing the IC package in a water bath.

9. The method of claim 8 wherein immersing the IC package in the water bath includes immersing the IC package in water having a temperature in a range of 70° C. to 90° C.

10. The method of claim 1 further comprising:
prior to forming the semi-transparent film, polishing a bulk Si layer surface; and,
in response to the polishing, thinning the bulk Si layer overlying the IC die first region.

11. A method for selectively exposing a region of integrated circuit (IC) die, the method comprising:
providing an IC die with a first region, located on a backside surface of a bulk silicon (Si) layer;
forming a semi-transparent film overlying the bulk Si layer, semi-transparent to light having a first wavelength;
irradiating the semi-transparent film with light having the first wavelength;
in response to irradiating the semi-transparent film with a first power density, locating the IC die first region;
in response to irradiating the semi-transparent film with a second power density, greater than the first power density, marking a region of the semi-transparent film;
selectively etching a region of the bulk Si layer underlying the semi-transparent film marked region; and,
exposing the IC die first region.

12. The method of claim 11 wherein marking the region of semi-transparent film with the second power density includes ablating a region of semi-transparent film overlying the IC die first region; and,
wherein exposing the IC die first region includes exposing the IC die first region in response to the selective etching the bulk Si region underlying the ablated region of semi-transparent film.

13. The method of claim 11 wherein exposing the IC die first region includes exposing the IC die first region in response to irradiating the selectively etched bulk Si region with a focused ion beam (FIB).

14. A method for selectively marking a region of integrated circuit (IC), the method comprising:
providing an IC die with a first region located on a backside surface of a bulk silicon (Si) layer;
forming a semi-transparent film overlying the bulk Si layer, semi-transparent to light having a first wavelength;
irradiating the semi-transparent film with light having the first wavelength;
in response to irradiating the semi-transparent film with a first power density, locating the IC die first region;
in response to irradiating the semi-transparent film with a second power density, greater than the first power density, marking a region of the semi-transparent film;
selectively etching a region of the bulk Si layer underlying the semi-transparent film marked region;
irradiating the selectively etched region of the bulk Si layer with a focused ion beam (FIB); and,
in response to the FIB, exposing the IC die first region.

* * * * *